(12) United States Patent
Yang et al.

(10) Patent No.: US 7,892,953 B2
(45) Date of Patent: Feb. 22, 2011

(54) METHOD FOR MAKING MULTI-CRYSTALLINE FILM OF SOLAR CELL

(75) Inventors: Tsun-Neng Yang, Taipei (TW); Shan-Ming Lan, Taoyuan County (TW); Chin-Chen Chiang, Taoyuan County (TW); Wei-Yang Ma, Taipei County (TW); Chien-Te Ku, Taoyuan County (TW); Yu-Hsiang Huang, Taoyuan County (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 0 days.

(21) Appl. No.: 11/980,769

(22) Filed: Oct. 31, 2007

(65) Prior Publication Data
US 2010/0261305 A1    Oct. 14, 2010

(51) Int. Cl.
*H01L 21/20* (2006.01)
(52) U.S. Cl. .................................... 438/487
(58) Field of Classification Search ............... None
See application file for complete search history.

(56) References Cited

U.S. PATENT DOCUMENTS

| 5,738,731 A * | 4/1998 | Shindo et al. ........... 136/249 |
| 6,281,427 B1 * | 8/2001 | Mitsuhiro et al. ......... 136/250 |
| 2002/0062858 A1 * | 5/2002 | Mowles ................. 136/252 |
| 2003/0013280 A1 * | 1/2003 | Yamanaka ............... 438/487 |

* cited by examiner

*Primary Examiner*—Charles D Garber
*Assistant Examiner*—Andre' C Stevenson
(74) *Attorney, Agent, or Firm*—Jackson IPG PLLC; Demian K. Jackson

(57) ABSTRACT

A method is disclosed to make a multi-crystalline silicon film of a solar cell. The method includes the step of providing a ceramic substrate, the step of providing a titanium-based film on the ceramic substrate, the step of providing a $p^+$-type back surface field layer on the titanium-based film, the step of providing a $p^-$-type light-soaking layer on the $p^+$-type back surface field layer and the step of conducting $n^+$-type diffusive deposition of phosphine on the $p^-$-type light-soaking layer based on atmospheric pressure chemical vapor deposition, thus forming an $n^+$-type emitter on the $p^-$-type light-soaking layer.

10 Claims, 9 Drawing Sheets

METHOD FOR MAKING MULTI-CRYSTALLINE FILM OF SOLAR CELL

FIELD OF THE INVENTION

The present invention relates to a solar cell and, more particularly, to a method for making a multi-crystalline silicon film of a solar cell.

DESCRIPTION OF THE RELATED ART

Most silicon-based solar cells are made in low-temperature processes based on plasma-enhanced chemical vapor deposition ("PECVD"). An amorphous silicon or multi-crystalline silicon film is coated on a glass, aluminum, silicon, stainless steel or plastic substrate. A back contact is made of aluminum, gold, silver or transparent conductive oxide such as indium-tin oxide ("ITO") and zinc oxide.

The primary advantage of the low-temperature processes is the wide variety of materials that can be used to make the substrates. However, they suffer drawbacks such as defective silicon films, low photoelectrical conversion efficiencies and low light-soaking stability.

In the PECVD, while coating the microcrystalline silicon film, a silicon material is highly diluted in hydrogen. For example, $[H_2]/[SiH_4]>15$. That is, the concentration or flow rate of $H_2$ is more than 15 times as high as that of $SiH_4$. The problems with the PECVD are a low growth rate of the film, a long process and a high cost.

Regarding the making of the poly-silicon solar cells, there are various techniques such as solid phase crystallization ("SPC") and aluminum-induced crystallization ("AIC"). The SPC is based on the PECVD. An amorphous silicon film is deposited, intensively heated and annealed at a high temperature. Thus, a poly-silicon film with a grain size of 1 to 2 micrometers is made.

In the AIC as shown in FIGS. 5 through 9, an aluminum film 32 is coated on a substrate 31. An amorphous silicon film 33 is coated on the aluminum film 32 based on the PECVD and annealed at a temperature of about 575 degrees Celsius for a long time to form a seeding layer 34. Then, it is subjected to an epitaxial process such as the PECVD or an electron cyclotron resonance chemical deposition ("ECR-CVD") to make a poly-silicon film 35. The AIC however involves many steps and takes a long time. The resultant grain size is about 0.1 to 10 micrometers.

As discussed above, regarding the conventional methods for making poly-silicon film solar cells in the low-temperature processes based on the PECVD, there are many defects in the silicon films, the photoelectrical conversion efficiencies are low, the light soaking stabilities low, the growth rates of the films low, the processes long, and the costs high. Concerning the method for making poly-silicon film solar cells based on the AIC, the processes are long for including many steps and therefore expensive.

The present invention is therefore intended to obviate or at least alleviate the problems encountered in prior art.

SUMMARY OF THE INVENTION

It is an objective of the present invention is to provide an efficient method for making a multi-crystalline silicon film of a solar cell.

It is another objective of the present invention to provide a method for providing a quality multi-crystalline silicon film of a solar cell.

It is another objective of the present invention to provide a method for making a multi-crystalline silicon film that can be used to make a solar cell that exhibits a high photoelectrical conversion efficiency and stability of the soaking of light.

To achieve the fore-going objectives, the method includes the step of providing a ceramic substrate, the step of providing a titanium-based film on the ceramic substrate, the step of providing a $p^+$-type back surface field layer on the titanium-based film, the step of providing a $p^-$-type light-soaking layer on the $p^+$-type back surface field layer and the step of conducting $n^+$-type diffusive deposition of phosphine on the $p^-$-type light-soaking layer based on atmospheric pressure chemical vapor deposition, thus forming an $n^+$-type emitter on the $p^-$-type light-soaking layer.

Other objectives, advantages and features of the present invention will become apparent from the following description referring to the attached drawings.

BRIEF DESCRIPTIONS OF THE DRAWINGS

The present invention will be described via the detailed illustration of the preferred embodiment referring to the drawings.

DESCRIPTIONS OF THE PREFERRED EMBODIMENTS

Figure 1:
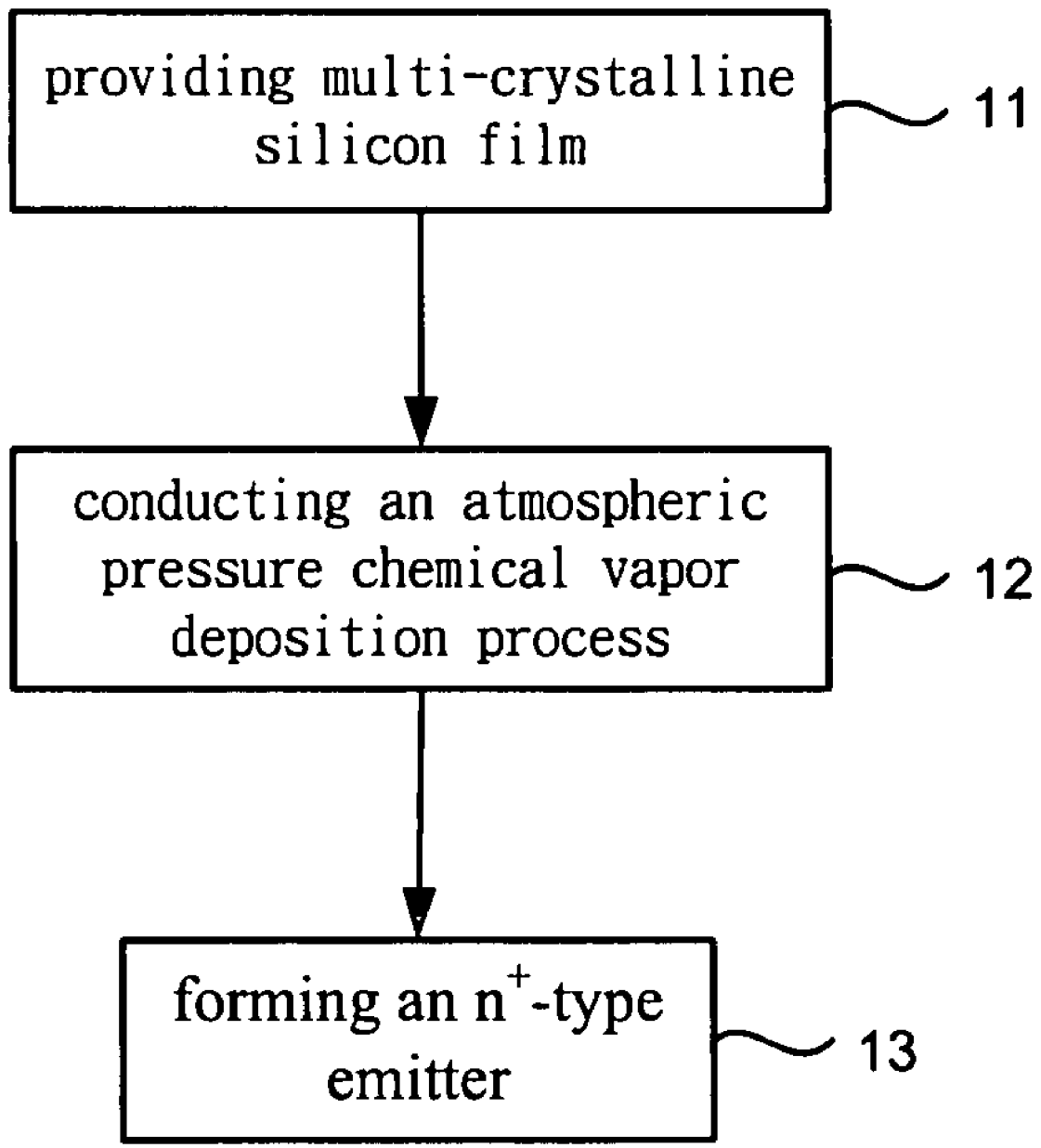
FIG. 1 is a flowchart of a method for making a multi-crystalline silicon film of a solar cell according to the preferred embodiment of the present invention.

Referring to FIG. 1, shown is a method for making a multi-crystalline silicon film of a solar cell according to the preferred embodiment of the present invention.

Figure 2:
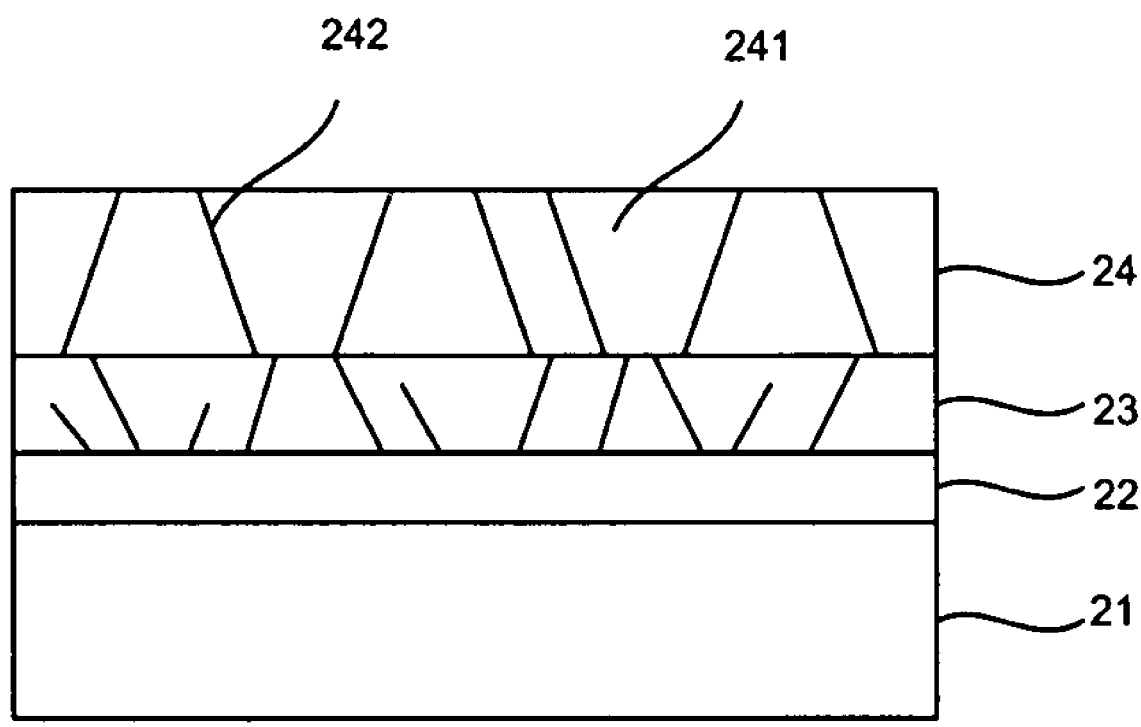
FIG. 2 is a side view of a ceramic substrate, a titanium-based film coated on the ceramic substrate, a $p^+$-type back surface field layer coated on the titanium-based film and a $p^-$-type light-soaking layer coated on the $p^+$-type back surface field layer in the method shown in FIG. 1.

Referring to FIGS. 1 and 2, at 11, a ceramic substrate 21 is provided. The ceramic substrate 21 is made of aluminum oxide. The thickness of the substrate 21 is about 0.1 to 1.0 mm.

A titanium-based film 22 is coated on the ceramic substrate 21. The thickness of the titanium-based film 22 is about 1000 to 5000 angstroms. The titanium-based film 22 is used both as a back contact and a seed layer. The titanium-based film 22 is made of $TiSi_2$, TiN, TiC, $TiB_2$ or $TiC_xN_y$.

The epitaxial growth of a $p^+$-type back surface field ("BSF") layer 23 is conducted on the titanium-based film 22. The thickness of the $p^+$-type BSF layer 23 is no larger than 1 micrometer.

The epitaxial growth of a p⁻-type light-soaking layer 24 is conducted on the p⁺-type BSF layer 23. The thickness of the p⁻-type light-soaking layer 24 is about 15 micrometers. The size of silicon crystals 241 at grain boundaries 242 in the p⁻-type light-soaking layer 24 is larger than 10 micrometers.

Figure 3:
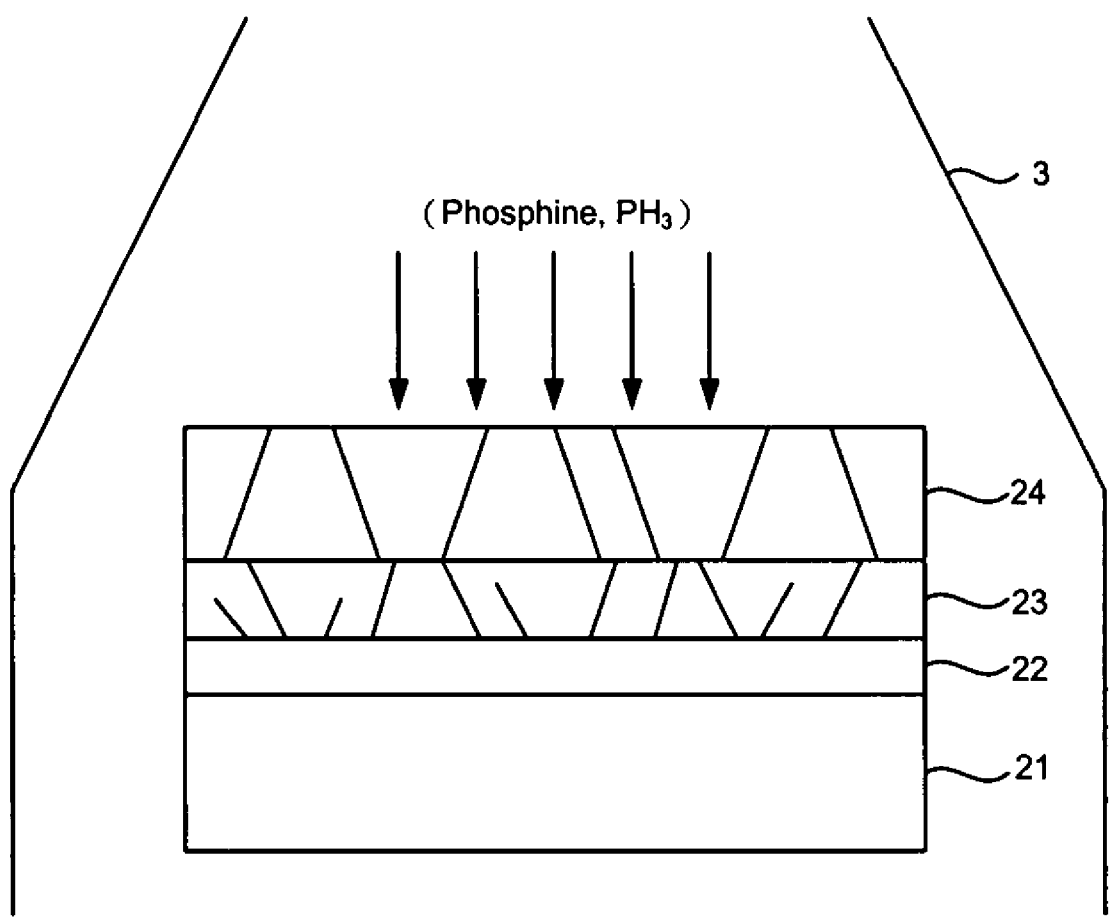
FIG. 3 is a side view of an atmospheric pressure chemical vapor deposition device for diffusively depositing phosphine on the $p^-$-type light-soaking layer shown in FIG. 2.

Referring to FIGS. 1 and 3, at 12, in an atmospheric pressure chemical vapor deposition ("APCVD") device 3, at about 800 to 1000 degrees Celsius, phosphine is diffusively deposited on the p⁻-type light-soaking layer 24. Thus, the n⁺-type diffusive deposition of the phosphorous atoms of the phosphine is conducted on the p⁻-type light-soaking layer 24.

Figure 4:
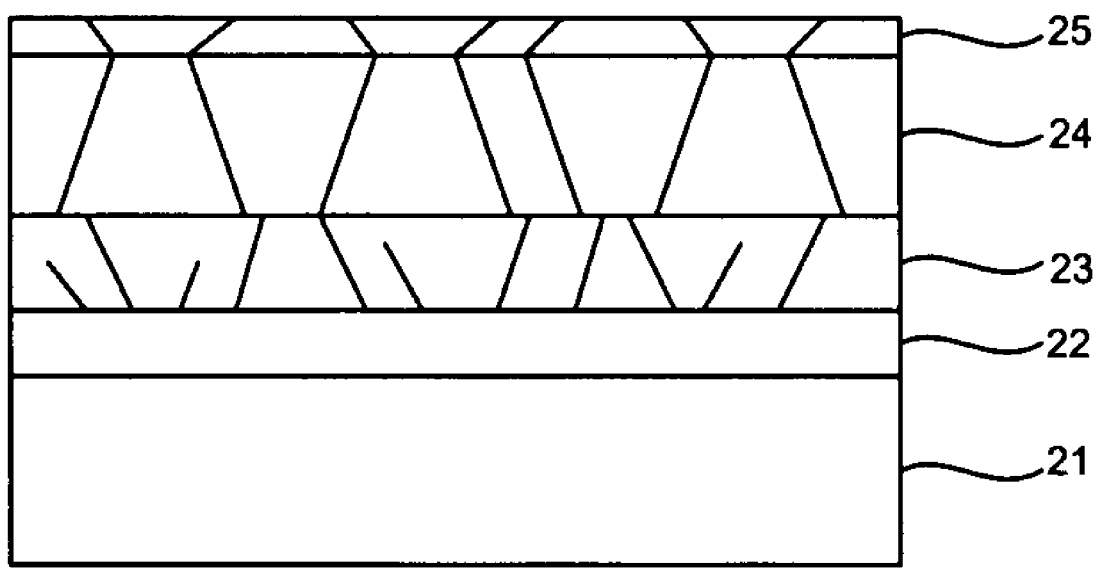
FIG. 4 is a side view of an $n^+$-type emitter coated on the $p^-$-type light-soaking layer shown in FIG. 3.
Figure 5:
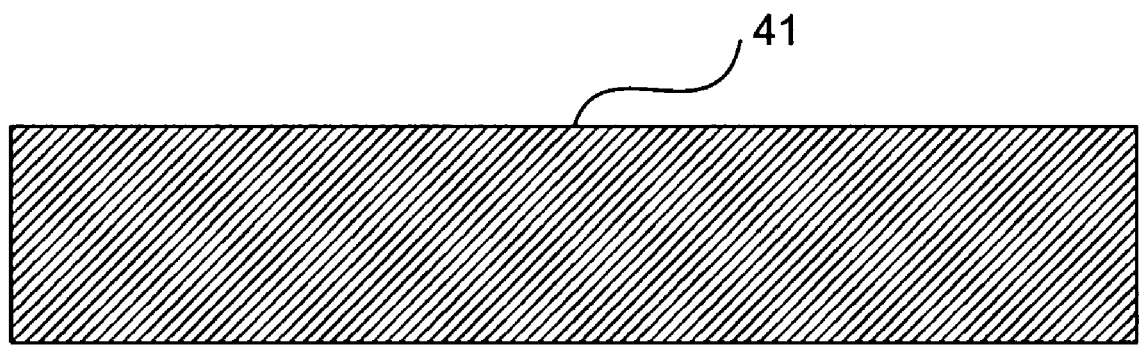
FIG. 5 is a side view of a substrate used in a conventional method for making a multi-crystalline silicon film.
Figure 6:
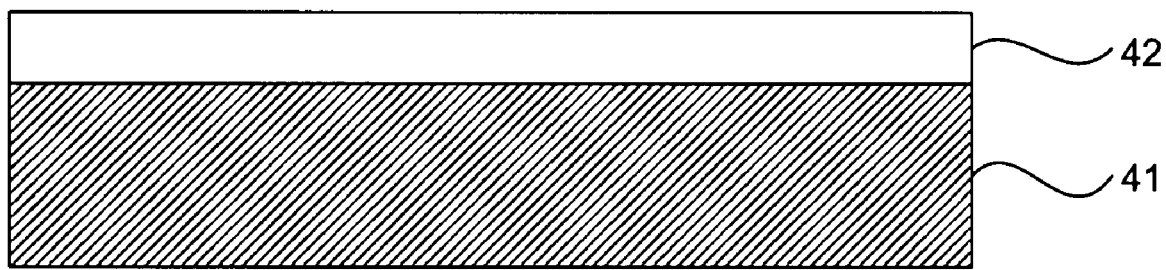
FIG. 6 is a side view of an aluminum film coated on the substrate shown in FIG. 5.
Figure 7:
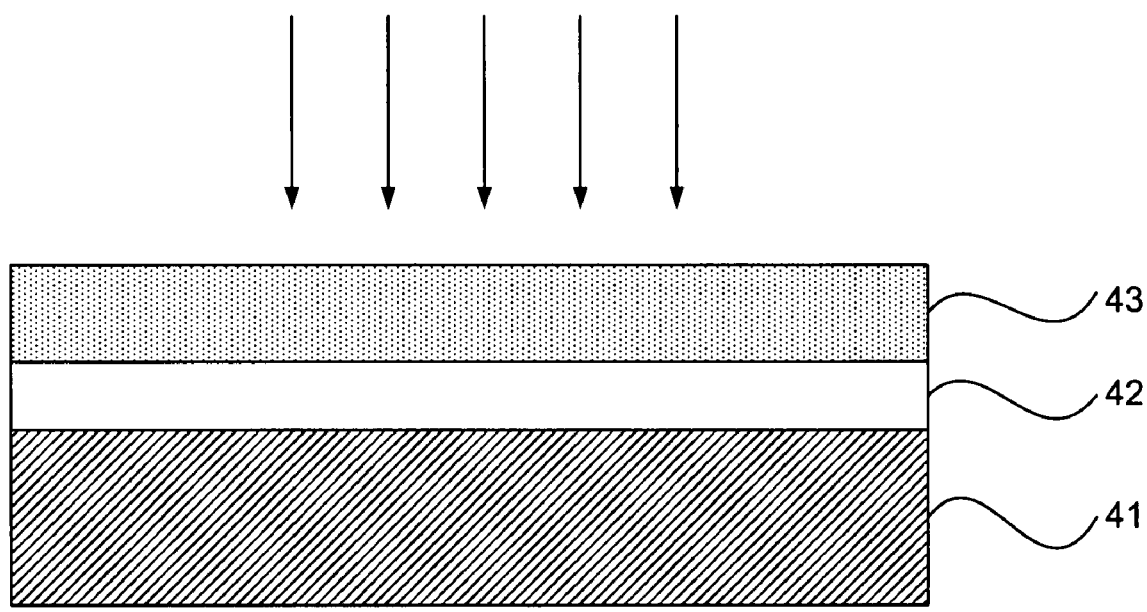
FIG. 7 is a side view of an amorphous silicon film coated on the aluminum film shown in FIG. 6.
Figure 8:
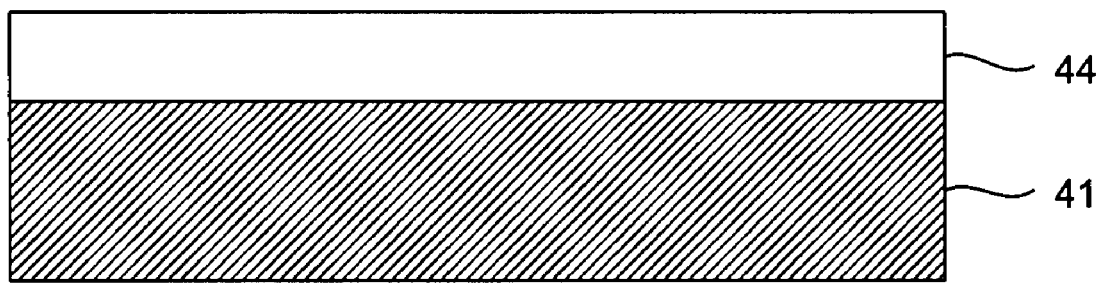
FIG. 8 is a side view of the substrate coated with a seed layer converted from the amorphous silicon film and the aluminum film shown in FIG. 7.
Figure 9:
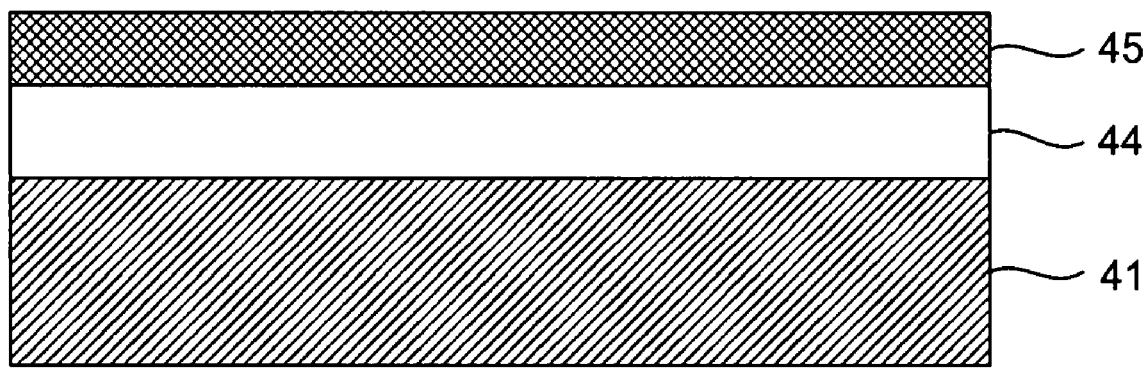
FIG. 9 is a side view of a multi-crystalline silicon film coated on the seed layer shown in FIG. 6.

Referring to FIGS. 1 and 4, at 13, an n⁺-type emitter 25 is coated on the p⁻-type light-soaking layer 24. The thickness of the n⁺-type emitter 25 is smaller than 1000 angstroms. The concentration of the phosphorous atoms in the n⁺-type emitter 25 is about $10^{18}$ to $10^{19}$#/mm³.

As discussed above, the atmospheric pressure chemical vapor deposition process is conducted at a high temperature. The ceramic substrate 21 is made of aluminum oxide. The titanium-based film 22 is used both as the back contact and the seed layer. The epitaxial growth of the P⁺-type BSF layer 23 and the p⁻-type light-soaking layer 24 is directly conducted on the titanium-based film 22. The n⁺-type diffusive deposition is conducted on the p⁻-type light-soaking layer 24. Thus, the n⁺-type emitter 25 thinner than 1000 angstroms is formed. Moreover, as multi-crystalline silicon exhibits high electron-hole mobility, large electron-hole diffusion length and long electron-hole recombination, the solar cell made according to the present invention exhibits a high epitaxial growth rate, excellent crystal quality, a high photoelectrical conversion efficiency and stable light-soaking. In addition, the cost of equipment is low, and the process simple.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

What is claimed is:

1. A method for making a multi-crystalline silicon film of a solar cell, the method comprising the steps of:
    providing a ceramic substrate;
    providing a titanium-based film on the ceramic substrate;
    providing a p+-type back surface field layer on the titanium-based film;
    providing a p--type light-soaking layer on the p+-type back surface field layer; and
    conducting n+-type diffusive deposition of phosphine on the p--type light-soaking layer based on atmospheric pressure chemical vapor deposition, thus forming an n+-type emitter on the p--type light-soaking layer.

2. The method according to claim 1, wherein the titanium-based film is made of a material selected from a group consisting of $TiSi_2$, TiN, TiC, $TiB_2$ and $TiC_xN_y$.

3. The method according to claim 1, wherein the thickness of the titanium-based film is about 1000 to 5000 angstroms.

4. The method according to claim 1, wherein the titanium-based film is used both as a back contact and a seed layer.

5. The method according to claim 1, wherein the thickness of the ceramic substrate is about 0.1 to 1.0 mm.

6. The method according to claim 1, wherein the thickness of the p⁺-type back surface field layer is no larger than 1 micrometer.

7. The method according to claim 1, wherein the thickness of the p⁻-type light-soaking layer is about 1 to 15 micrometers, and the grain size of the p⁻-type light-soaking layer is larger than 10 micrometers.

8. The method according to claim 1, wherein the n⁺-type diffusive deposition is conducted at 800 to 1000 degrees Celsius.

9. The method according to claim 1, wherein the thickness of the n⁺-type emitter is smaller than 1000 angstroms.

10. The method according to claim 1, wherein the concentration of the phosphorous atoms in the n⁺-type emitter is about $10^{18}$ to $10^{19}$#/mm³.

* * * * *